United States Patent
Nagatome

(10) Patent No.: US 6,339,753 B1
(45) Date of Patent: Jan. 15, 2002

(54) METHOD AND SYSTEM FOR EMULATING COMPUTER-CONTROLLED APPARATUS

(75) Inventor: Toshihide Nagatome, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/121,963

(22) Filed: Jul. 24, 1998

(30) Foreign Application Priority Data

Sep. 29, 1997 (JP) .......................................... H9-263533

(51) Int. Cl.[7] .............................................. G06F 9/455
(52) U.S. Cl. ........................................ 703/28; 703/14
(58) Field of Search .............................. 326/64, 68, 69, 326/71, 73; 327/24; 714/45, 724; 371/22.1, 29.1; 703/14, 28

(56) References Cited

U.S. PATENT DOCUMENTS

| | | | | |
|---|---|---|---|---|
| 4,277,827 A | * | 7/1981 | Carlson et al. .............. 364/200 |
| 4,506,164 A | * | 3/1985 | Higuchi ........................ 326/81 |
| 4,563,601 A | * | 1/1986 | Asano et al. ................. 326/73 |
| 4,713,896 A | * | 12/1987 | Ogiue et al. ............. 365/225.6 |
| 4,968,902 A | * | 11/1990 | Jackson ........................ 327/74 |
| 5,119,314 A | * | 6/1992 | Hotta et al. .................. 364/491 |
| 5,245,224 A | * | 9/1993 | Suzuki et al. .................. 326/65 |
| 5,282,213 A | * | 1/1994 | Leigh et al. ................. 714/724 |
| 5,300,835 A | * | 4/1994 | Assar et al. .................... 326/68 |
| 5,311,083 A | * | 5/1994 | Wanlass ........................ 326/68 |
| 5,412,262 A | * | 5/1995 | Nishio et al. .................. 326/64 |
| 5,583,454 A | * | 12/1996 | Hawkins et al. .............. 326/81 |
| 5,592,108 A | * | 1/1997 | Tsukahara ..................... 326/69 |
| 5,612,892 A | * | 3/1997 | Almulla ....................... 364/489 |
| 5,642,478 A | * | 6/1997 | Chen et al. ............ 395/183.21 |
| 5,675,824 A | * | 10/1997 | Steele ........................... 712/1 |
| 5,883,538 A | * | 3/1999 | Keeth et al. ................ 327/333 |
| 5,917,339 A | * | 6/1999 | Kim ............................ 326/68 |
| 6,028,468 A | * | 2/2000 | Menniti et al. ............. 327/333 |

OTHER PUBLICATIONS

Ching et al., P.C. An In–Circuit Emulator for TMS320C25, IEEE Transactiuons on Education, vol. 37, No. 1, Feb. 1994, pp. 51–56.*

Link Instruments, Inc. Logic Analyzers Flyer, pp. 1–11.*

Link Instruments, Inc. Pattern Generator Flyer, pp. 1–3.*

Hewlett Packard Press Release, 'HP adds Benchtop Logic Analyzers With Pattern Generation Capabilities', pp. 1–2, Dec. 19, 1997.*

Hewlett Packard Product Overview, 'Emulation and Analysis solutions for Hitachi SH4 Series Microprocessors' pp. 1–11.*

* cited by examiner

Primary Examiner—Russell W. Frejd
(74) Attorney, Agent, or Firm—Venable; Robert J. Frank; Jeffrey W. Gluck

(57) ABSTRACT

A first supply voltage is applied to a computer-controlled apparatus and to a first block of a simulator, while a second supply voltage is applied to a designator unit and to a second block of the simulator. The operation of the computer-controlled apparatus is simulated by the simulator in response to instruction signals supplied from the designator unit.

13 Claims, 4 Drawing Sheets

METHOD AND SYSTEM FOR EMULATING COMPUTER-CONTROLLED APPARATUS

CROSS REFERENCE TO RELATED APPLICATION

This application claims the priority of Application No. H09-263533, filed Sep. 29, 1997 in Japan, the subject matter of which is incorporated herein by reference.

TECHNICAL FIELD OF THE INVENTION

The present invention relates to a method and a system for emulating a computer-controlled apparatus, such as a microcomputer application system.

BACKGROUND OF THE INVENTION

In general, an in-circuit emulator is designed to cause a computer to behave as if it were another component. Emulators are used in computer development for enabling existing hardware and software to simulate the computer that is under development.

A conventional in-circuit emulator is arranged between a parent calculating apparatus, such as a PC (Personal Computer), and a microcomputer application system to be evaluated. The microcomputer application system includes a microcomputer. The in-circuit emulator includes a simulation circuit to simulate the operation of the microcomputer, including a central processing unit (CPU), a random access memory (RAM), and peripheral circuits. The simulation circuit is formed on a simulator chip.

The in-circuit emulator further includes a designator unit, which is realized with a RAM or the like, behaving like a read-only memory (ROM) in the microcomputer application system. The designator unit supplies instruction signals or control signals to the simulator chip.

In such an in-circuit emulator, a supply voltage, for example 5 V, is usually applied to the simulator chip and to the designator unit. In another case, another level of supply voltage, for example 3 V, is applied in common to the simulator chip and to the microcomputer application system.

According to the conventional in-circuit emulator, when the same level of supply voltage V is applied to the simulator chip and the designator unit, the supply voltage to be applied to the microcomputer application system is also equalized to the supply voltage V. If the supply voltage to be applied to the microcomputer application system is different from the supply voltage V, it is necessary to provide a voltage level shift circuit between the in-circuit emulator and the microcomputer application system.

The level shift circuit may cause off-timing problems; and therefore, the results of emulation (simulation) may be different from those of the actual operation of the microcomputer application system.

On the other hand, when the supply voltage V for the simulator chip is designed to be identical to the supply voltage applied to the microcomputer application system, it is necessary to provide a voltage level shift circuit between the designator unit and the simulator chip. Between the designator unit and the simulator chip, signals must be transferred at a high speed. The voltage level shift circuit may slow the operating speed of the in-circuit emulator. As a result, reliability of the emulation decreases.

OBJECTS OF THE INVENTION

Accordingly, an object of the invention is to provide a method in which a computer-controlled apparatus is emulated with a high reliability.

Another object of the invention is to provide an emulation system with which a computer-controlled apparatus is emulated with a high reliability.

Additional objects, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the invention, a second supply voltage is applied in common to a computer-controlled apparatus and to a first block of a simulator, while a first supply voltage is applied in common to a designator unit and to a second block of the simulator. The operation of the computer-controlled apparatus is simulated by the simulator in response to instruction signals supplied from the designator unit.

According to a second aspect of the invention, an emulator includes a designator unit that supplies instruction signals for simulation and a simulator that simulates the operation of a computer-controlled apparatus. The simulator includes a first block connected to the designator unit and a second block connected to the designator unit. The emulator further includes a first power supply that applies a first voltage to the computer-controlled apparatus and to the first block of the simulator in common; and a second power supply that applies a second voltage to the designator unit and to the second block of the simulator in common. The simulator simulates the operation of the computer-controlled apparatus in response to instruction signals supplied from the designator unit.

The emulator may further include a level shifter that converts the voltage level of signals transmitted between the first block and second block of the simulator. Otherwise, in the emulator, the first block of the simulator may include an input circuit of a TTL (Transistor-Transistor Logic) gate and an output circuit of a CMOS (Complementary Metal-Oxide Semiconductor) transistor. In addition, the second block of the simulator may include an input circuit of a TTL (Transistor-Transistor Logic) gate and an output circuit of a CMOS (Complementary Metal-Oxide Semiconductor) transistor. The output circuit of the first block of the simulator is connected to the input circuit of the second block of the simulator, and the input circuit of the first block of the simulator is connected to the output circuit of the second block of the simulator.

DETAILED DISCLOSURE OF THE INVENTION

Figure 1:
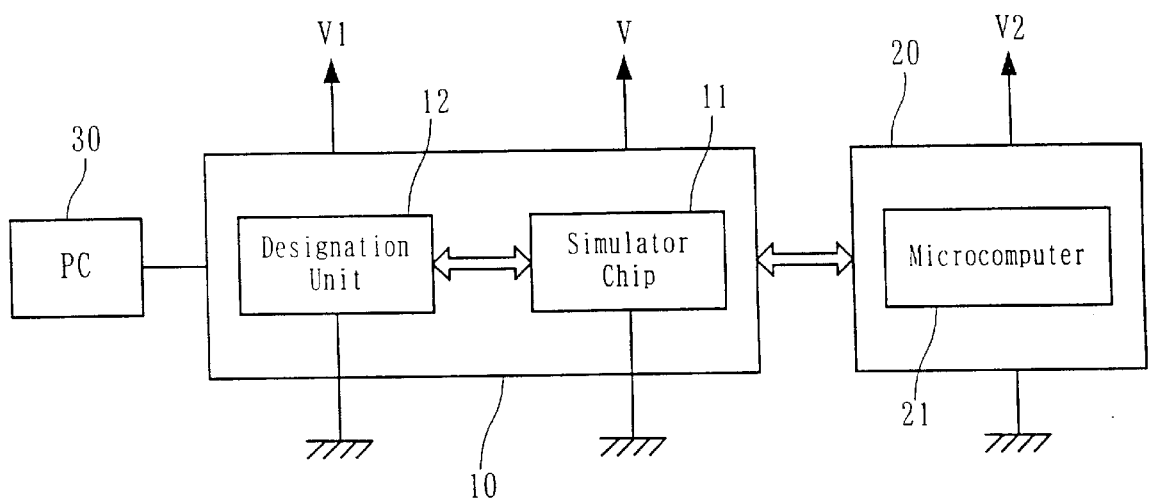
FIG. 1 is a block diagram illustrating a conventional emulation system.

FIG. 1 shows the configuration of a conventional in-circuit emulator 10. The in-circuit emulator 10 is arranged between a calculating apparatus, such as a PC (personal computer) 30, and a microcomputer application system 20, which is to be evaluated. The microcomputer application system includes a microcomputer 21, including a central processing unit (CPU), a random access memory (RAM), and peripheral circuits. The in-circuit emulator 10 includes a simulator chip 11 that simulates the operation of the microcomputer 21.

The in-circuit emulator 10 further includes a designation unit 12, which is realized with a RAM or the like, simulating a read-only memory (ROM) in the microcomputer application system 20. The designation unit 12 supplies instruction signals to the simulator chip 11.

In the in-circuit emulator 10, a supply voltage V, for example 5 V, applied to the simulator chip 11 is usually set to be identical to a supply voltage V1 applied to the designation unit 12. In another case, the supply voltage V1 is set to be identical to a supply voltage V2, for example 3V, applied to the microcomputer application system 20.

According to the above-described conventional in-circuit emulator, when the same level of supply voltage (V =V1) is applied to the simulator chip 11 and the designation unit 12, the supply voltage V2 applied to the microcomputer application system 20 should also be equalized to the supply voltage V (=V1). If the supply voltage V2 applied to the microcomputer application system 20 is different from the supply voltage V (=V1), it is necessary to provide a voltage level shift circuit between the in-circuit emulator 10 and the microcomputer application system 20.

The voltage level shift circuit may cause off-timing problems; and therefore, the results of emulation (simulation) may be different from those of the actual operation of the microcomputer application system 20.

On th e other hand, when the supply voltage V for the simulator chip 11 is identical to the supply voltage V2 for the microcomputer application system 20, it is necessary to provide a voltage level shift circuit between the designation unit 12 and the simulator chip 11. Between the designator unit 12 and the simulator chip 11, signals must be transferred at a high speed. The voltage level shift circuit may slow the operating speed of the in-circuit emulator 10.

First Preferred Embodiment

Figure 2:
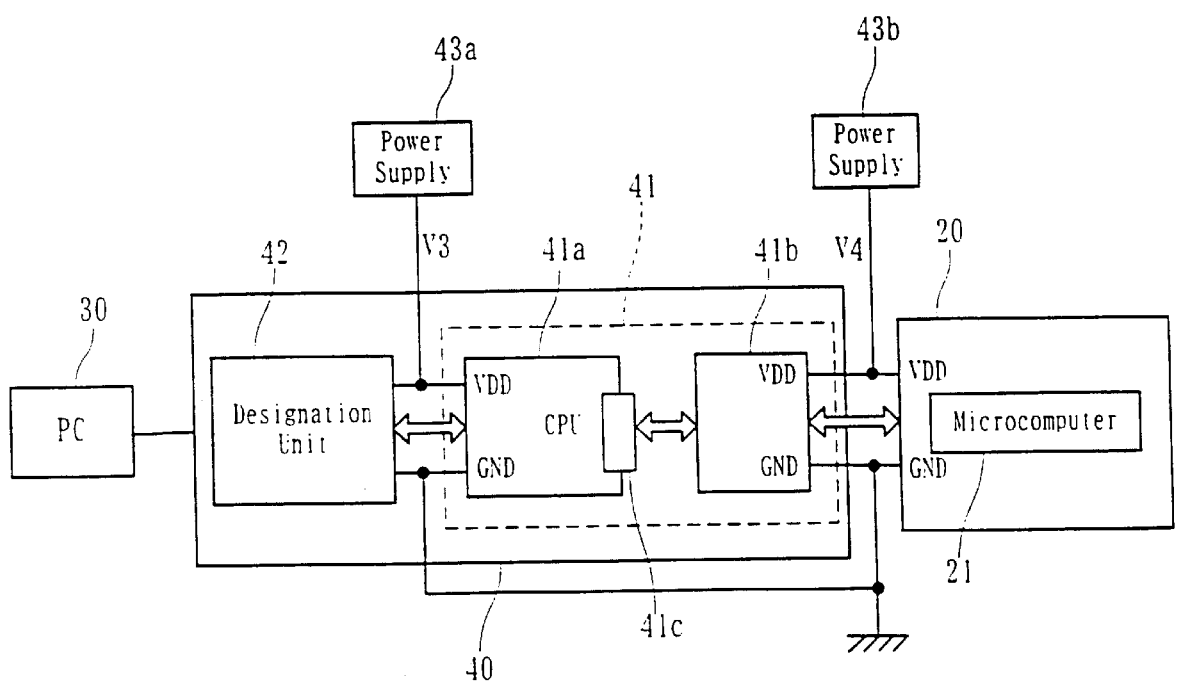
FIG. 2 is a block diagram illustrating an emulation system according to a first preferred embodiment of the invention.

FIG. 2 shows the configuration of an in-circuit emulator 40 of the first preferred embodiment of the present invention. In this embodiment, the same or corresponding elements to those shown in FIG. 1 are indicated with the same reference numerals. The in-circuit emulator 40 is arranged between a microcomputer application system 20 and a parent calculating machine, which is realized with a personal computer (PC) 30 or the like.

The microcomputer application system 20 includes a microcomputer 21, including a central processing unit (CPU), a random access memory (RAM), and peripheral circuits. The in-circuit emulator 40 includes a simulator chip 41 that simulates the operation of the microcomputer 21. The in-circuit emulator 40 further includes a designation unit 42, which is realized with a RAM or the like, simulating a read-only memory (ROM) in the microcomputer application system 20. The designation unit 42 is designed to supply instruction signals to the simulator chip 41.

The simulator chip 41 includes a CPU block 41a and a peripheral block 41b. A first power supply 43a is connected to the designation unit 42 and the CPU block 41a, while a second power supply 43b is connected to the peripheral block 41b and the microcomputer application system 20. In other words, the designation unit 42 and the CPU block 41a are supplied with the first common supply voltage of V3 from the power supply 43a, while the peripheral block 41b and the microcomputer application system 20 are supplied with the first common supply voltage of V4 from the power supply 43b.

The CPU block 41a includes an arithmetic logic unit (ALU), corresponding to the microcomputer 21; a program counter; a register and a RAM, which are not shown. The CPU block 41a is provided with a voltage level shift circuit (shifter) 41c, connected to the peripheral block 41b.

The peripheral block 41b includes a timer, a serial port, a parallel port and an A/D converter, which are not shown. Between the voltage level shift circuit 41c and the peripheral block 41b, an address bus, a data bus, a read-signal line and a write-signal line are connected.

The designation unit 42 designates the operation of the simulator chip 41 so that the in-circuit emulator 40 accurately emulates the operation of the microcomputer application system 20. The simulator chip 41 is controlled based on the instruction signals from the designation unit 42 to star/stop the simulating operation, to read/write data from/to a register, to perform breaking of program execution, and to trace execution histories. In general, the simulator chip 41 is not provided with a facility corresponding to a ROM in the microcomputer 21, so the designation unit 42 may include a static RAM capable of acting as the ROM.

The CPU block 41a, the peripheral block 41b, and the designation unit 42 are grounded to the same level as the microcomputer application system 20.

Next, the operation of the in-circuit emulator 40 will be described. In the simulator chip 41, the CPU block 41a simulates the operation of the microcomputer 21 in response to the instruction signals from the designation unit 42. The results of the simulation are transferred to the microcomputer application system 20 via the peripheral block 41b.

In such a process, the voltage level shift circuit 41c shifts the voltage level of signals transferred between the CPU block 41a and peripheral block 41b. Specifically, a signal supplied from the CPU block 41a to the peripheral block 41b is changed in level from V3 to V4. On the other hand, a signal supplied from the peripheral block 41b to the CPU block 41a is changed in level from V4 to V3. Between the peripheral block 41b and the microcomputer application system 20, signals are transferred with the voltage V4.

As mentioned above, in the first preferred embodiment, the simulator chip 41 includes the CPU block 41a and the peripheral block 41b, and the CPU block 41a is provided with the voltage level shift cicruit 41c. The supply voltage V3 is applied in common to the designation unit 42 and the CPU block 41a. The supply voltage V4 is applied in common to the microcomputer application system 20 and the peripheral block 41b.

As a result, signals are transferred at a high speed between the CPU block 41a and the designation unit 42. It is not required to provide a voltage level shift circuit between the microcomputer application system 20 and the peripheral block 41b. Consequently, the microcomputer application system 20 can be operated at actual timing; and therefore, the microcomputer application system 20 can be emulated precisely. Furthermore, it is possible to emulate the microcomputer application system 20 having a wide range of operating voltage by activating and deactivating the voltage level shift circuit 41c.

Second Preferred Embodiment

Figure 3:
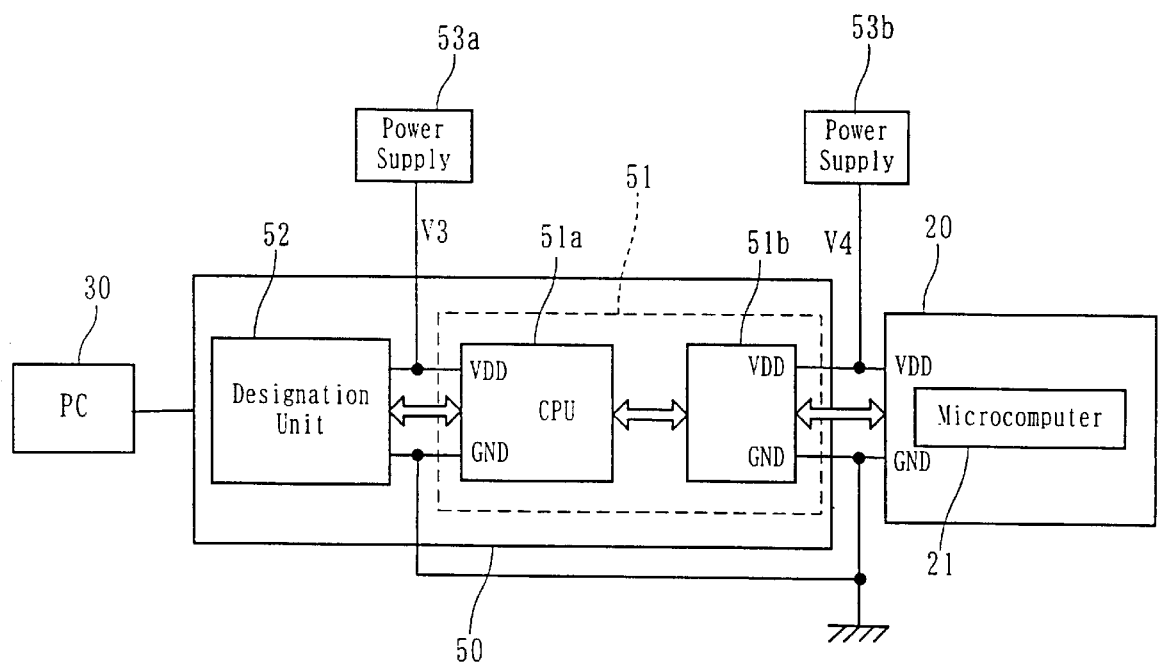
FIG. 3 is a block diagram illustrating an emulation system according to a second preferred embodiment of the invention.

FIG. 3 shows the configuration of an in-circuit emulator 50 according to a second preferred embodiment of the present invention. In this embodiment, the same or corresponding elements to those shown in FIGS. 1 and 2 are indicated with the same reference numerals. The in-circuit emulator 50 is arranged between a microcomputer application system 20 and a parent calculating machine, which is realized with a personal computer (PC) 30 or the like.

The microcomputer application system 20 includes a microcomputer 21, including a central processing unit (CPU), a random access memory (RAM), and peripheral circuits. The in-circuit emulator 50 includes a simulator chip 51 that simulates the operation of the microcomputer 21. The in-circuit emulator 50 further includes a designation unit 52, which is realized with a RAM or the like, simulating a read-only memory (ROM) in the microcomputer application system 20. The designation unit 52 is designed to supply instruction signals to the simulator chip 51.

The simulator chip 51 includes a CPU block 51a and a peripheral block 51b. A first power supply 53a is connected to the designation unit 52 and the CPU block 51a, while a second power supply 53b is connected to the peripheral block 51b and the microcomputer application system 20. In other words, the designation unit 52 and the CPU block 51a are supplied with the first common supply voltage of V3 from the power supply 53a, while the peripheral block 51b and the microcomputer application system 20 are supplied with the second common supply voltage of V4 from the power supply 53b.

The CPU block 51a includes an arithmetic logic unit (ALU), corresponding to the microcomputer 21; a program counter; a register and a RAM, which are not shown. The CPU block 51a is not provided with a voltage level shift circuit (shifter).

The peripheral block 51b includes a timer, a serial port, a parallel port and an A/D converter, which are not shown. The CPU block 51a and the peripheral block 51b are directly coupled to each other by an address bus, a data bus, a read-signal line and a write-signal line.

The designation unit 52 designates the operation of the simulator chip 51 so that the in-circuit emulator 50 accurately emulates the operation of the microcomputer application system 20. The simulator chip 51 is controlled based on the instruction signals from the designation unit 52 to start/stop the simulating operation, to read/write data from/to a register, to perform breaking of program execution, and to trace execution histories. In general, the simulator chip 51 is not provided with a facility corresponding to a ROM in the microcomputer 21; the designation unit 52 may include a static RAM capable of acting as the ROM.

The CPU block 51a, the peripheral block 51b, and the designation unit 52 are grounded to the same level as the microcomputer application system 20.

Figure 4:
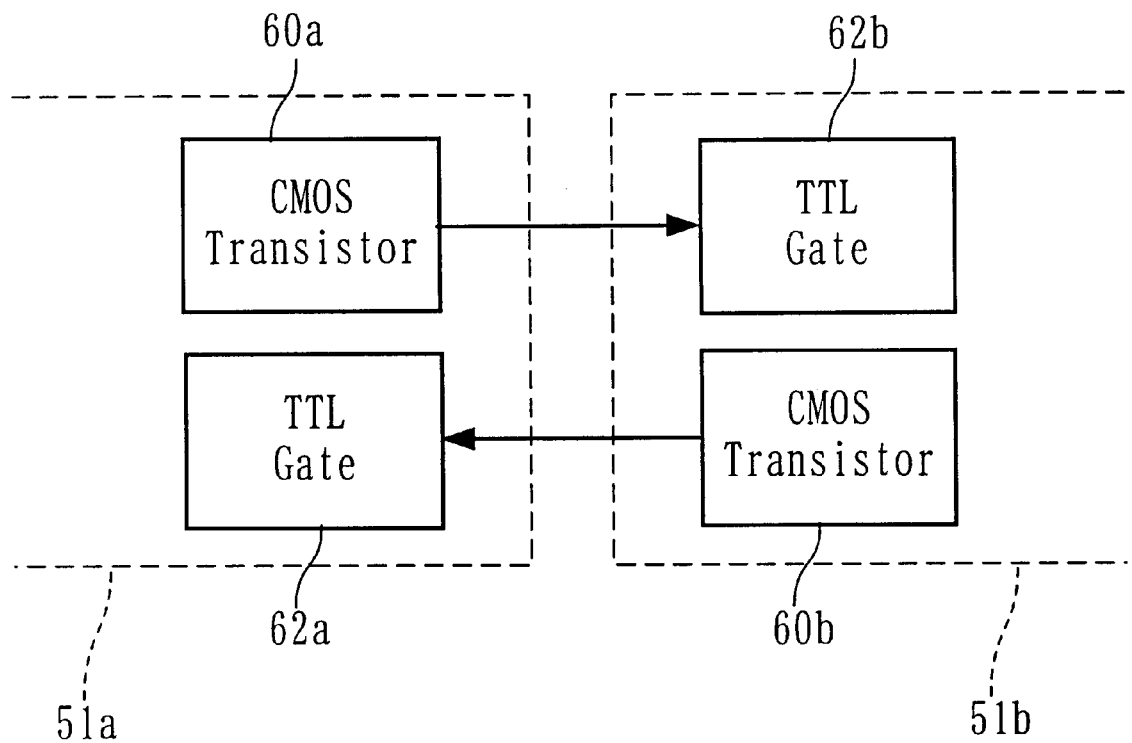
FIG. 4 is a block diagram illustrating a part of the emulation system according to the second preferred embodiment.

FIG. 4 shows the connection between the CPU block 51a and the peripheral block 51b. The CPU block 51a is provided at an output terminal with a CMOS (Complementary Metal-Oxide Semiconductor) transistor 60a, and at an input terminal with a TTL (.Transistor-Transistor Logic) gate 62a. The peripheral block 51b is provided at an output terminal with a CMOS transistor 60b, and at an input terminal with a TTL (Transistor-Transistor-Logic) gate 62b.

The logical level of a signal supplied from the CPU block 51a to the peripheral block 51b corresponds to an output level of the CMOS transistor 60a, and is detected with TTL decision levels by the TTL gate 62b. On the other hand, the logical level of a signal supplied from the peripheral block 51b to the CPU block 51a also corresponds to an output level of the CMOS transistor 60b, and is also detected with TTL decision levels by the TTL gate 62a.

Next, the operation of the in-circuit emulator 50 will be described. In the simulator chip 51, the CPU block 51a simulates the operation of the microcomputer 21 in response to the instruction signals from the designation unit 52. The results of the simulation are transferred to the microcomputer application system 20 via the peripheral block 51b.

In this embodiment, it is assumed that the voltage levels V3 and V4 are set to 5V and 3V, respectively. An output signal of the CPU block 51a to be supplied to the peripheral block 51b has the CMOS-specific level. The following equations (1) and (2) give a high-level voltage $V_{OH1}$ and low-level voltage $V_{OL1}$ of the output signal of the CPU block 51a:

$$V_{OH1}=0.8 \times V3=0.8 \times 5=4.0[V] \quad (1)$$

$$V_{OL1}=0.4[V] \quad (2)$$

The CPU block 51a has upper and lower decision levels of $V_{IH1}$ and $V_{IL1}$ as shown in the following equations (3) and (4):

$$V_{IH1}=2.2[V] \quad (3)$$

$$V_{IL1}=0.8[V] \quad (4)$$

An output signal supplied from the peripheral block 51b to the CPU block 51a has the CMOS-specific level. The expression (5) and (6) below therefore give a high-level voltage $V_{OH2}$ and low-level voltage $V_{OL2}$.

$$V_{OH2}=0.8 \times V4=0.8 \times 3=2.4[V] \quad (5)$$

$$V_{OL2}=0.3 [V] \quad (6)$$

The peripheral block 51b has upper and lower decision levels of $V_{IH2}$ and $V_{IL2}$ as shown in the following equations (7) and (8):

$$V_{IH2}=1.8 [V] \quad (7)$$

$$V_{IL2}=0.5 [V] \quad (8)$$

As described above, according to the second preferred embodiment, the simulator chip 51 includes the CPU block 51a and the peripheral block 51b. The first supply voltage V3 is applied in common to the designation unit 52 and to the CPU block 51a of the simulator chip 51. The second supply voltage V4 is applied in common to the microcomputer application system 20 and the peripheral block 51b of the simulator chip 51. As a result, signals are transferred at a high speed between the CPU block 51a and the designation unit 52.

It is not necessary to provide a voltage level shift circuit between the microcomputer application system 20 and the peripheral block 51b. Consequently, the microcomputer application system 20 can be operated at actual timing; and therefore, the microcomputer application system 20 can be emulated precisely. In addition, the CPU block 51a and the peripheral block 51b supply CMOS-specific level of output signals, and those signals are detected in TTL-specific levels. According to the second preferred embodiment, it is unnecessary to have the voltage level shift circuit 41c used in the first preferred embodiment.

The present invention is not limited to the aforesaid embodiments, but various variants can be constructed. The variants will be described by taking some examples below:

(1) A plurality of simulator chips may be included in the in-circuit emulator 40 (50).

(2) In the first preferred embodiment, the voltage level shift circuit 41c is included in the CPU block 41a. Alternatively, the voltage level shift circuit 41c may be included in the peripheral block 41b.

(3) The CMOS-specific levels and TTL-specific levels are not limited to the ones presented in the second preferred embodiment.

What is claimed is:

1. A method for emulating a computer-controlled apparatus, using a simulator and a designator unit, comprising the steps of:

applying a first supply voltage in common to the designator unit and to a first block of the simulator;

applying a second supply voltage, different from said first supply voltage, in common to the computer-controlled apparatus and to a second block of the simulator; and simulating the operation of the computer-controlled apparatus by the simulator in response to instruction signals supplied from the designator unit.

2. The method, according to claim 1, further comprising the step of:

converting the voltage level of signals transmitted between the first block and second block of the simulator.

3. The method according to claim 1, further comprising the steps of:

generating, by the designator unit, an instruction signal comprising signal levels corresponding to a level of said first supply voltage, the instruction signal designating operation orders for said computer-controlled apparatus;

simulating said computer-controlled apparatus in accordance with said instruction signal and providing output signals comprising operation orders for the computer-controlled apparatus and corresponding to the simulation, the output signals comprising signal levels corresponding to a level of said first supply voltage;

shifting the signal levels of the output signals to correspond to a level of said second supply voltage; and transferring the output signals to the computer-controlled apparatus.

4. The method according to claim 3, further comprising the step of transferring the level-shifted output signals to a peripheral block from which they are transferred to the computer-controlled apparatus.

5. An emulator that emulates a computer-controlled apparatus, comprising:

a designator unit that supplies instruction signals for simulation;

a simulator that simulates the operation of the computer-controlled apparatus, in which the simulator comprises a first block connected to the designator unit and a second block connected to the computer-controlled apparatus;

a first power supply that supplies a first voltage to both of the designator unit and first block of the simulator; and a second power supply that supplies a second voltage, which is different from said first voltage, to both of the computer-controlled apparatus and the second block of the simulator, wherein the simulator simulates the operation of the computer-controlled apparatus in response to instruction signals supplied from the designator unit.

6. The emulator, according to claim 5, further comprises:

a level shifter that converts the voltage level of signals transmitted between the first block and second block of the simulator.

7. The emulator, according to claim 5, wherein the simulator simulates the operation of a microcomputer in the computer-controlled apparatus; and the designator unit performs the function of a ROM (Read Only Memory) in the computer-controlled apparatus.

8. The emulator, according to claim 5, wherein the first block of the simulator is realized with a CPU (Central Processing Unit) block comprising at least an ALU (Arithmetic Logic Unit); and the second block of the simulator is realized with a periphery block that supplies/receives signals to/from the computer-controlled apparatus.

9. The emulator, according to claim 5, wherein the first block of the simulator comprises an input circuit of a TTL (Transistor-Transistor Logic) gate and an output circuit of a CMOS (Complementary Metal-Oxide Semiconductor) transistor; and the second block of the simulator comprises an input circuit of a TTL (Transistor-Transistor Logic) gate and an output circuit of a CMOS (Complementary Metal-Oxide Semiconductor) transistor, wherein the output circuit of the first block of the simulator is connected to the input circuit of the second block of the simulator, and the input circuit of the first block of the simulator is connected to the output circuit of the second block of the simulator.

10. The emulator according to claim 5, wherein said first block of the simulator comprises a central processing unit and a level shift circuit, said level shift circuit changing the voltage level of signals transmitted between said first block of the simulator and said second block of the simulator.

11. An in-circuit emulator coupled to a microcomputer, emulating a program stored in said microcomputer, using a first supply voltage and a second supply voltage, where the second supply voltage is lower than the first supply voltage, the in-circuit emulator comprising:

a designation unit that supplies instruction signals; and a simulator chip that simulates said program in accordance with said instruction signals, supplied by the designation unit, the simulator chip comprising:

a peripheral block that transmits data to and receives data from the microcomputer, the microcomputer and the peripheral block being supplied with the second supply voltage; and a CPU block that transmits data to and receives data from the designation unit, the CPU block and the designation unit being supplied with the first supply voltage, the CPU block including a voltage level shift circuit for changing signals based on one of the first and second supply voltages to signals based on the other one of the first and second supply voltages, data being transmitted between the CPU and the peripheral block via said voltage level shift circuit.

12. A method for emulating a computer-controlled apparatus supplied with a second supply voltage, the method comprising the steps of:

generating an instruction signal, the instruction signal comprising signal levels in accordance with a first supply voltage different from the second supply voltage, the instruction signal designating operation orders for said computer-controlled apparatus;

generating output signals based on the instruction signal, the output signals comprising signal levels in accordance with the first supply voltage, the output signals being generated in accordance with the instruction signal;

shifting the signal levels of the output signals to signal levels in accordance with the second supply voltage; and transferring the level-shifted output signals to the computer-controlled apparatus, to simulate the operation thereof.

13. An emulator that emulates a computer-controlled apparatus, the computer-controlled apparatus being supplied with a second supply voltage, the emulator comprising:

a first block that outputs an instruction signal that designates operation orders for the computer-controlled apparatus, the first block being supplied with a first supply voltage different from the second supply voltage;

a second block comprising a level-shifting circuit and a CPU, the second block generating output signals in accordance with the instruction signal, the second block being supplied with the first supply voltage; and a third block that interfaces with the computer-controlled apparatus to operate the computer-controlled apparatus in accordance with the output signals, wherein the level-shifting circuit changes the signal levels of the output signals after their generation by the CPU of the second block and prior to their being supplied to the third block.

* * * * *